(12) United States Patent
Tellez Oliva et al.

(10) Patent No.: US 10,808,320 B2
(45) Date of Patent: Oct. 20, 2020

(54) METHOD FOR SYNTHESISING A MATERIAL

(71) Applicant: DIAROTECH S.A., Gilly (BE)

(72) Inventors: Horacio J. Tellez Oliva, Charleroi (BE); Alain Roch, Le Roeulx (BE); Etienne Lamine, Court-Saint-Etienne (BE)

(73) Assignee: DIAROTECH S.A., Gilly (BE)

(*) Notice: Subject to any disclaimer, the term of this patent is extended or adjusted under 35 U.S.C. 154(b) by 183 days.

(21) Appl. No.: 16/069,696

(22) PCT Filed: Jan. 16, 2017

(86) PCT No.: PCT/EP2017/050763
§ 371 (c)(1),
(2) Date: Jul. 12, 2018

(87) PCT Pub. No.: WO2017/121892
PCT Pub. Date: Jul. 20, 2017

(65) Prior Publication Data
US 2019/0024236 A1    Jan. 24, 2019

(30) Foreign Application Priority Data
Jan. 15, 2016   (BE) .................. 2016/5032

(51) Int. Cl.
*C30B 29/04* (2006.01)
*C23C 16/48* (2006.01)
(Continued)

(52) U.S. Cl.
CPC ............ *C23C 16/483* (2013.01); *C23C 16/27* (2013.01); *C23C 16/278* (2013.01); *C23C 16/30* (2013.01);
(Continued)

(58) Field of Classification Search
CPC .......... C30B 29/04; C30B 25/02; C30B 25/04
See application file for complete search history.

(56) References Cited

U.S. PATENT DOCUMENTS
4,898,748 A    2/1990   Kruger, Jr.

FOREIGN PATENT DOCUMENTS
EP      2526220       8/2016
WO   2012013824      2/2012

OTHER PUBLICATIONS

Schwarz et al., "synthesis of diamond coatings on tungsten carbide with photon plasmatron", Diamond and related materials, vol. 14, 2006 pp. 302-307.*

(Continued)

*Primary Examiner* — Robert M Kunemund
(74) *Attorney, Agent, or Firm* — Duane Morris LLP; Gregory M. Lefkowitz; Jason M. Nolan

(57) ABSTRACT

The method involves a substrate 21 near which reagents 25 are provided. Pump (26) and Raman (27) photons make it possible to create a stimulated Raman emission during the synthesis (29) of the material. The Raman emission can be Stokes or anti-Stokes. In one embodiment of the invention, the zone where the synthesis (29) occurs is in an optical cavity and Raman photons (27) emitted by the Raman emission are reoriented toward the zone where the synthesis (29) occurs. In another embodiment of the invention, the zone where the synthesis (29) occurs is not in an optical cavity, and a stream of Raman photons (27) is created in an outside optical cavity before being sent toward the zone where the synthesis (29) occurs. The synthesis (29) preferably involves a CVD method or solidification by the Czochralski method.

22 Claims, 5 Drawing Sheets

(51) Int. Cl.
    *C23C 16/27*           (2006.01)
    *C23C 16/30*           (2006.01)
    *C30B 15/26*           (2006.01)
    *C30B 29/22*           (2006.01)
    *C23C 16/50*           (2006.01)
    *C30B 15/00*           (2006.01)

(52) U.S. Cl.
    CPC .............. *C23C 16/50* (2013.01); *C30B 15/00* (2013.01); *C30B 15/26* (2013.01); *C30B 29/04* (2013.01); *C30B 29/22* (2013.01)

(56) References Cited

OTHER PUBLICATIONS

Lindstam et al, "Halogen lamp assisted high rate deposition of obth hard and elastic carbon films from CH2I2" Nuclear Instruments and Methods in Phscis Reasrch B 192 2002 pp. 274-279.*

Hunermann et al "Observation of Interface Phonons by Light Scattering from epitaxial Sb monolayers on III-V semiconductors" Physical Reviews Letters col. 66 No. 5. Feb. 4, 1991 640-643.*

J.E. Butler et al, "Understanding the chemical vapor deposition of diamond: recent progress", Journal of Physics condensed Matter, 21, 2009.

Buhler et al., "Back-scattering CARS diagnostics on CVD diamond", Diamond and Related Materials, 8, 1999, pp. 673-676.

* cited by examiner

METHOD FOR SYNTHESISING A MATERIAL

CROSS-REFERENCE TO RELATED APPLICATIONS

This application is a § 371 national stage entry of International Application No. PCT/EP2017/050763, filed on Jan. 16, 2017, which claims priority to Belgium Patent Application No. BE2016/5032, filed on Jan. 15, 2016, the entire contents of which are incorporated herein by reference.

TECHNICAL FIELD

According to a first aspect, the present invention relates to a method for synthesizing a material, for example diamond. According to a second aspect, the present invention relates to a device for synthesizing a material.

PRIOR ART

Document WO2012/013824 A1 discloses a method according to which electromagnetic radiation is sent, during chemical vapor deposition (CVD), in order to increase the growth speed of the synthesized material. The electromagnetic radiation takes the form of a photon beam, the frequencies of which correspond to the absorption (intrinsic or activated by default) and inelastic scattering (of photons and neutrons) frequencies of the material to be synthesized.

It would be advantageous to further increase the growth speed of the synthesized material. It would also be advantageous to improve the quality of the synthesized material.

BRIEF DESCRIPTION OF THE INVENTION

According to a first aspect, one aim of the invention is to provide a method making it possible to address some of the aforementioned problems. To that end, the invention proposes a method for synthesizing a material, the method comprising the following steps:
1) providing a chamber,
2) placing a substrate arranged to bear the material to be synthesized in the chamber,
3) providing a photon-generating device arranged to send pump photons into the chamber,
4) providing reagents in the chamber to synthesize said material,
5) providing means for steering Raman photons in the chamber, preferably toward the substrate,
6) synthesizing the material on the substrate from reagents,
7) sending pump photons into the chamber, and
8) steering Raman photons toward the substrate.

Steering Raman photons toward the substrate makes it possible to steer them toward a zone where the material synthesis occurs, and where, according to the invention, it is desirable for a stimulated Raman emission to occur.

The pump photons allow an excitation toward an excited energy state, and the Raman photons make it possible to stimulate a Raman emission from an excited energy state.

The steps of the method according to the invention thus make it possible to meet the conditions for a Raman effect. This Raman effect may have several advantages.

It may make it possible to initiate or activate the synthesis of the material. If reactions other than the synthesis of the desired material are possible, it may make it possible to favor the synthesis of the desired material relative to these other reactions by minimizing the corresponding reactive energy path. It may also make it possible to improve the structure of the material to be synthesized, for example by allowing crystallization of part of the material that had initially been formed amorphously during the synthesis.

In the context of the present document, a Raman photon is a photon able to stimulate a Raman emission and/or a photon emitted by Raman emission, and may be Stokes or anti-Stokes. When they are sent toward the material in order to stimulate a Raman emission, the Raman photons are "stimulation photons" or "probe photons". When they are emitted by material by spontaneous or stimulated Raman emission, the Raman photons are "emitted photons".

In the context of the present document, a Raman emission may correspond to a linear Raman effect, a nonlinear Raman effect or a combination, and involve multiple transitions between energy states, whether they are radiative or other states. In the context of the present document, a Raman effect may be a Hyper-Raman effect.

In one embodiment of the invention, the means for steering Raman photons in the chamber comprise a device allowing a change of direction of Raman photons and step 8) comprises a change of direction of Raman photons. This embodiment of the invention is particularly suitable when the material itself, following an earlier spontaneous or stimulated Raman emission, is a source of Raman photons.

Preferably, the change of direction of Raman photons is done using an optical cavity. Such a cavity is particularly suitable for creating an amplification of the Raman emissions.

In one embodiment of the invention, the means for steering Raman photons in the chamber comprise a device for generating Raman photons. This embodiment of the invention is particularly suitable when a device other than the material itself is a source of Raman photons.

Preferably, the device for generating Raman photons is comprises [sic] an optical cavity and an element capable of generating Raman photons, and the substrate is arranged outside the device for generating Raman photons.

Advantageously, steps 6), 7) and 8) are simultaneous.

In one embodiment of the invention, the method comprises a step for total reflection of the pump photons on a surface close to the reagents. This total reflection allows a high density of pump photons near a surface of the substrate where the material synthesis occurs. This results in a large quantity of Raman emissions in this part of the substrate, which is particularly advantageous on the part of the surface serving as a starting point for the synthesis.

In one embodiment of the invention, the frequency of Raman photons is lower than the frequency of pump photons.

In one embodiment of the invention, the frequency of Raman photons is high than the frequency of pump photons.

Advantageously, the method further comprises creating an electron-hole pair and phonon pumping.

Advantageously, intermediate energy states are present between the valence band and the conduction band and further comprise that pump photons induce excitations between two of these intermediate states and that anti-Stokes Raman emissions stimulated by Raman photons induce dropouts between two of these intermediate energy states.

With the method according to the invention, the material to be synthesized may for example be a solid material, a monocrystalline solid material, a polycrystalline solid material, an amorphous solid material, a solid material able to be synthesized by CVD, a solid material able to be synthesized by epitaxy, a solid material having a diamond-type crystalline structure, a solid material with the same composition as diamond but being at least partially amorphous, diamond, silicon, a doped or non-doped semiconducting compound, an alloy, for example a metallic alloy. Other types of material may nevertheless be synthesized with the method according to the invention.

In one embodiment of the invention, the step for providing reagents in the chamber comprises:
provide a gas in the chamber,
ionizing at least part of the gas so as to form a plasma comprising ions, and wherein the synthesis of the material on the substrate comprises a deposition of ions on the substrate.

In one embodiment of the invention,
the step for providing reagents in the chamber comprises providing a liquid in the chamber,
the substrate comprises a seed, and
the synthesis of the material on the substrate on a reagent base (25) comprises solidification using the Czochralski method.

According to a second aspect, one aim of the invention is to provide a device making it possible to address some of the aforementioned problems. To that end, the invention proposes a device for synthesizing a material, the device comprising:
a chamber,
a substrate holder arranged so as to hold a substrate,
a door arranged to place a substrate on the substrate holder,
a photon-generating device arranged to send pump photons into the chamber,
an inlet arranged to make it possible to provide reagents in the chamber, and
means for steering Raman photons in the chamber, preferably toward the substrate.

The advantages mentioned for the method apply mutatis mutandis to the device.

Preferably, the means for steering Raman photons in the chamber comprise a device allowing a change of direction of Raman photons and capable of steering Raman photons toward the substrate.

Advantageously, the device arranged to carry out a change of direction of Raman photons comprises two mirrors arranged to reflect, toward a substrate held by the substrate holder, Raman photons coming from a substrate held by the substrate holder.

Preferably, at least one of the mirrors is a dichroic mirror arranged to allow the pump photons coming from the photon-generating device to pass.

Advantageously, the device arranged to carry out a change of direction of Raman photons comprises an optical cavity.

Preferably, the photon-generating device comprises a pulsed laser. A pulsed laser is particularly appropriate for the pump photons, since it allows a particularly intense stream of pump photons, which leads to particularly numerous Raman emissions. Furthermore, the use of a pulsed pump photon beam makes it possible to remain unbalanced and for there to be less scattering in the material being formed.

In one embodiment of the invention, the chamber is arranged to be able to be placed under vacuum and to be able to contain an ion plasma and further comprising a plasma-creating device able to ionize at least part of the gas to form a plasma near a substrate held by the substrate holder.

In another embodiment of the invention, the chamber is arranged to be able to contain a liquid, in which the substrate holder is an elongate element arranged to be able to pull a substrate into a liquid separation movement and further comprising an inlet arranged to introduce a liquid into the chamber.

BRIEF DESCRIPTION OF THE FIGURES

Other features and advantages of the invention will appear upon reading the following detailed description, for the understanding of which reference will be made to the appended drawings, in which.

DETAILED DESCRIPTION OF THE INVENTION

The present invention is described with specific embodiments and references to figures, but the invention is not limited by these. The described drawings and figures are merely schematic, and are not limiting.

In the context of the present document, the terms "first" and "second" are used solely to differentiate between the various elements and do not imply any order between these elements.

In the figures, identical or similar elements may bear the same references.

Figure 1:
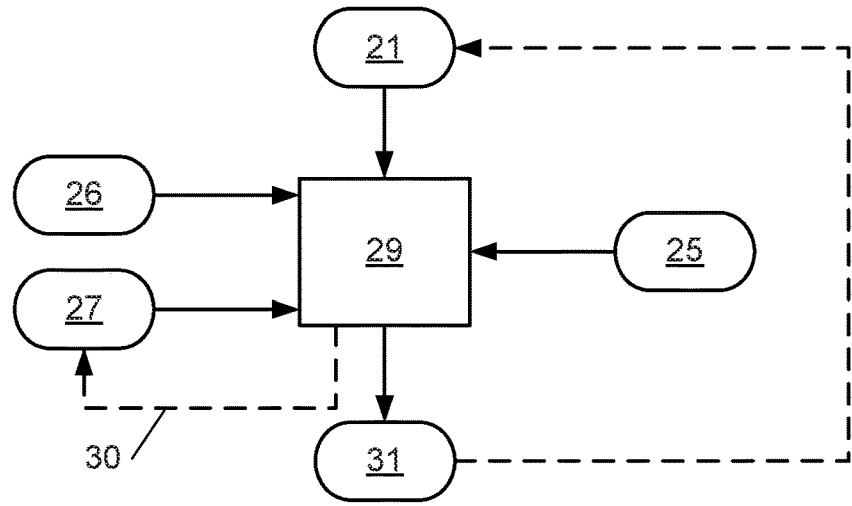
FIG. 1 illustrates a method according to the invention for synthesizing a material using Raman photons.

FIG. 1 illustrates a method 20 for synthesizing a material using Raman photons.

FIGS. 2a to 2d show energy states that may potentially be involved in the method 20: a first state 41, a second state 42 and a third state 43. The second state 42 corresponds to a higher energy level than the first state 41, and the third state 43 corresponds to a higher energy level than the second state 42. The first state 41 can be the ground state, the second state 42 can be a vibrationally excited state, and the third state 43 can be a higher excited state than the second state 42. The third state 43 can be a virtual energy state. The third state 43 can be a state of the valence band. The third state 43 can be a state created by the presence of an impurity or a crystalline flaw.

Figure 2A:
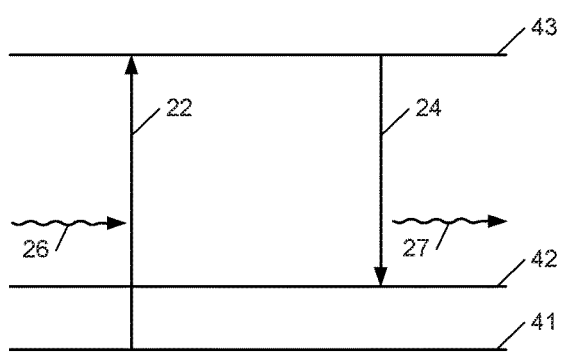
FIG. 2a illustrates energy states and the transitions involved in the method according to the invention in the case of a spontaneous Stokes Raman emission.
Figure 2B:
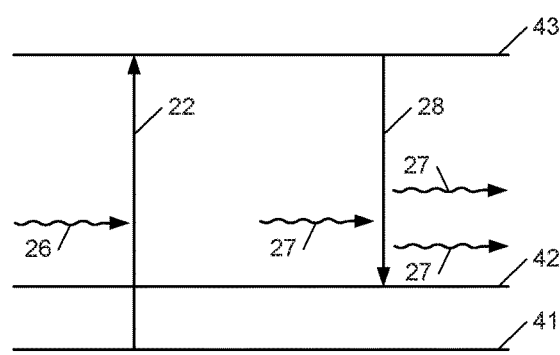
FIG. 2b illustrates energy states and the transitions involved in the method according to the invention in the case of a stimulated Stokes Raman emission.
Figure 2C:
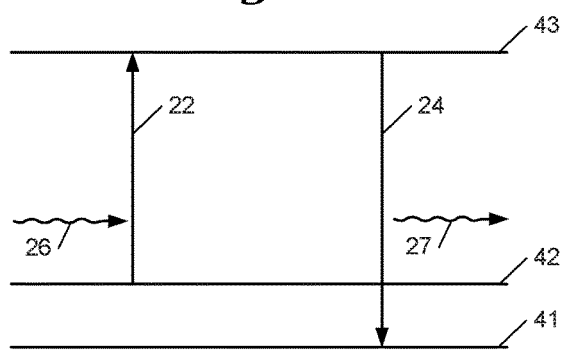
FIG. 2c illustrates energy states and the transitions involved in the method according to the invention in the case of a spontaneous anti-Stokes Raman emission.
Figure 2D:
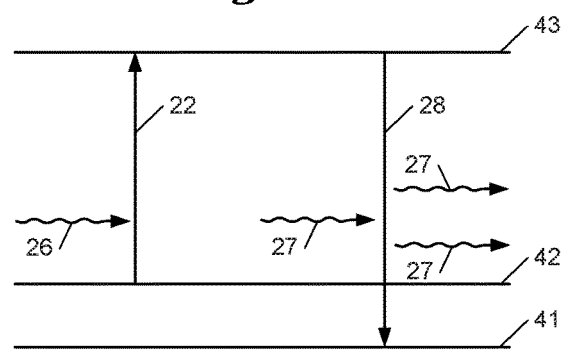
FIG. 2d illustrates energy states and the transitions involved in the method according to the invention in the case of a stimulated anti-Stokes Raman emission, FIG. 3 schematically shows the structure of a device for synthesizing material by CVD according to a first embodiment of the invention, FIG. 4 schematically shows the structure of a device for synthesizing material using the Czochralski method according to a second embodiment of the invention, FIG. 5 schematically shows an arrangement of certain elements of the device in an embodiment of the invention where the substrate, the reagents and the synthesis zone are in an optical cavity.

FIG. 2a illustrates the transitions in the case of a spontaneous Stokes Raman emission, FIG. 2b illustrates the transitions in the case of a stimulated Stokes Raman emission, FIG. 2c illustrates the transitions in the case of a spontaneous anti-Stokes Raman emission, FIG. 2d illustrates the transitions in the case of a stimulated anti-Stokes Raman emission.

Returning to FIG. 1, a substrate 21 is placed in the presence of reagents 25 allowing the synthesis of a material 31 on this substrate 21.

Pump photons 26 are sent so as to create a transition toward the third energy state 43 (FIG. 2) in the material 31, for example by optical pumping. The pump photons 26 have an energy equal to the difference in energies between the third state 43 and the first state 41 in the case of the use of Stokes Raman photons (FIG. 2b) and the pump photons 26 have an energy equal to the difference in energies between the third state 43 and the second state 42 in the case of the use of anti-Stokes Raman photons (FIG. 2d).

Raman photons 27, having a frequency such that they are able to stimulate a stimulated Raman emission 28 in the material 31, are also sent so as to stimulate a stimulated Raman emission 28 in the material 31.

The sending of the pump photons 26 and Raman photons 27 is preferably done simultaneously with the synthesis 29 of the material. In one embodiment of the invention, the pump photons 26 and the Raman photons 27 are sent after the synthesis 29 of the material, which makes it possible to correct any flaws in a crystalline structure of the material 31.

The stimulated Raman emission 28 leads to the emission of Raman photons 27. The simulated Raman emission 28 generates, per received Raman photons 27, two Raman photons 27 whose energy is equal to that of the received Raman photons 27 (FIGS. 2b and 2d). In one embodiment of the invention, these emitted Raman photons 27 are reoriented 30 so as to induce new stimulated Raman emissions 28.

In one embodiment of the invention, the pump photons 26 are polarized. In particular, the arrangement relative to the substrate 21 of a photon-generating device 32 sending the pump photons 26 can be chosen so that the polarization direction and/or the incidence direction of the pump photons 26 corresponds to a maximal Raman gain direction, in which the likelihood of creating a Raman transition is particularly high. Furthermore, the arrangement relative to the substrate 21 of means for reorienting Raman photons 27 orients the substrate can be chosen [sic] so that the polarization direction and/or the incidence direction of the Raman photons 27 corresponds to a determined direction.

In one embodiment of the invention, the synthesis 29 is further encouraged by an absorption of photons having a frequency equal to a frequency present in one of the electromagnetic absorption and inelastic scattering spectrums of the material to be synthesized, as described in document WO2012/013824 A1.

In one embodiment of the invention, the synthesis 29 is an epitaxy.

The synthesized material 31 can then serve as substrate 21 for the continuation of the synthesis procedure of the synthesis method 20. The synthesized material 31 to be synthesized can be a solid material, a liquid or even a gas.

Each Raman photon 27 used during the stimulated Raman emission 28 leads to two emitted Raman photons 27, if the emitted Raman photons 27 are reoriented 30 toward a synthesis zone 29, an amplification phenomenon occurs of the number of photons having a frequency equal to the frequency of a photon emitted by Raman effect and therefore an amplification of the number of transmissions by stimulated Raman emission. This results in an acceleration of the synthesis 29 of the material.

The substrate 21 is preferably crystalline or polycrystalline. The substrate 21 and the synthesized material 31 can be of the same nature, during a homoepitaxy, for example, or of different natures, during a heteroepitaxy, for example.

The synthesis method according to the invention in particular makes it possible to synthesize a solid material, a monocrystalline solid material, a polycrystalline solid material, an amorphous solid material, a solid material able to be synthesized by CVD, a solid material able to be synthesized by epitaxy, a solid material having a diamond-type crystalline structure, a solid material with the same composition as diamond but being at least partially amorphous, a diamond, a diamond comprising impurities, silicon, PbWO4, Ba $(NO_3)_2$, $KGd(WO_4)_2$, $BaMoO_4$, $SrMoO_4$, $SrWO_4$, $CaMoO_4$, $CaWO_4$, $TeO_2$ or $PbMoO_4$.

In a first embodiment, the synthesis 29 is a CVD and the reagents 25 are plasma ions created near a surface of the substrate.

In alternatives according to the first embodiment of the invention, the synthesis 29 is a deposition by simple CVD, by PECVD with a continuous plasma, by PECVD with a radiofrequency plasma, by PECVD with a plasma produced by microwave, by CVD with a plasma produced by combustion, by PECVD with a plasma torch.

The synthesis method according to the first embodiment of the invention in particular makes it possible to synthesize a solid material, a monocrystalline solid material, a polycrystalline solid material, an amorphous solid material, a solid material able to be synthesized by CVD, a solid material able to be synthesized by epitaxy, a solid material having a diamond-type crystalline structure, a solid material with the same composition as diamond but being at least partially amorphous or a diamond.

According to a first example use of the method according to the first embodiment of the invention, the substrate 21 and the synthesized material 31 are diamond. A gas used to form the plasma may comprise $CH_4$ or $C_2H_2$, and $H_2$, and the ions 25 of the plasma may comprise $CH^+_3$. The frequency of the pump photons 26 may be chosen to be suitable for generating surface C—H or C—C vibrations. In particular, a wavelength between 3.3 and 3.5 μm can be used for the pump photons 26, so as to excite the transverse elongation mode of the C—H bond. Pump photons 26 with this wavelength can for example be obtained by HeNe-type laser resonating at 3.39 μm or by a power laser followed by an optical crystal.

Figure 3:
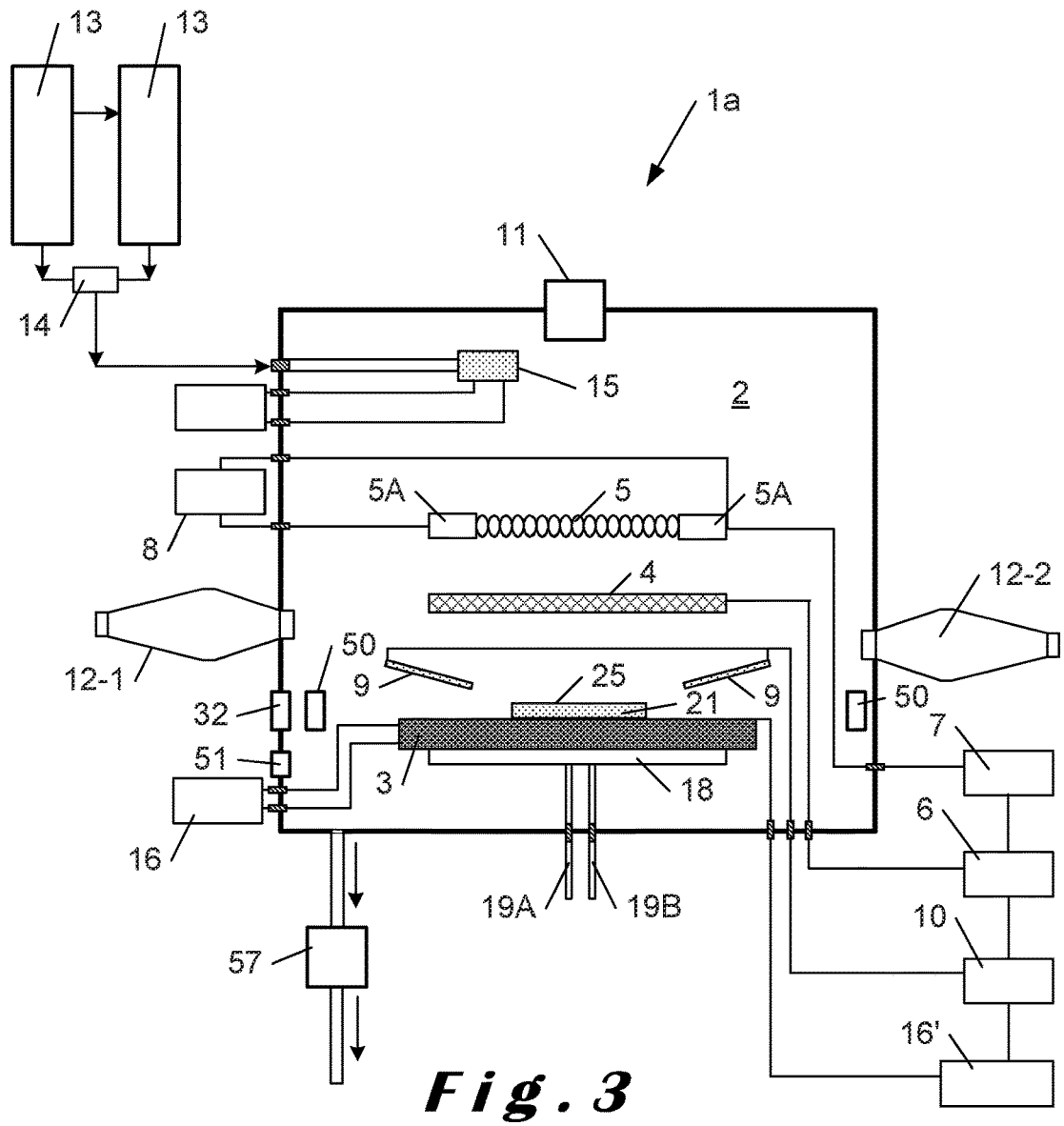

FIG. 3 schematically shows the structure of a device 1a for carrying out the method according to the first embodiment of the invention. The device 1a is arranged to apply a method for synthesizing a material by hot filament chemical vapor deposition (HFCVD). It will, however, be clear that the illustrated device also allows any other method for synthesis by chemical vapor deposition (CVD) of a material and that the invention is not limited to the HFCVD method, but applies to any CVD method.

The device 1a illustrated in FIG. 3 includes a vacuum chamber 2, which is preferably brought to a pressure of $10^{-3}$ Torr before starting the synthesis method. The chamber is placed under vacuum in a known manner, for example using a pump. The chamber contains a substrate holder 3, for example formed by a plate, arranged to hold the substrate 21. The substrate 21 can be any substance compatible for performing the deposition, for example diamond, W, WCCo, WCNi, silica, etc.

The substrate holder is preferably connected to a first voltage source 16 with alternating current for reasons that will be described later. If applicable, the substrate holder is also connected to a direct current source 16'. The substrate holder 3 is preferably mounted on a cooling plate 18 used to regulate the temperature of the substrate. To that end, a coolant inlet 19A and outlet 19B are connected to this cooling plate 18.

Above the substrate is a gate 4, and above the gate is a filament 5. The filament is preferably mounted between two collimators 5A, which are used to focus the electric field for better collimation of the plasma. The collimators allow better distribution of the temperature, as well as the plasma in the deposition region. It must also be noted that the invention is not limited to the position of the gate and the filament as illustrated in FIG. 3, and that these positions can be reversed.

The gate 4 is connected to a second voltage source 6, and the filament 5 to a third voltage source 7. The second and third voltage sources are DC voltage sources. The gate may, if applicable, also be connected to a fourth AC voltage source (not shown in the drawing). The filament is also connected to a fifth voltage source 8, which is an AC voltage source. The first, second and third voltage sources are used to vary the electric potential between the substrate, the gate and the filament, while the fifth voltage source 8 is used to heat the filament. By varying the electric potential between the substrate, the gate and the filament, it is possible to vary the electric field in the chamber and thus to check the plasma that will be produced in the chamber. The voltage applied on the filament and the gate may vary between 0.1 and 400 Volts depending on the material to be synthesized. The gate is essentially used to regulate the flow of chemical substances carrying radicals or unsaturated molecules present in the chamber, while the filament is used to activate the gas.

The device 1a according to the invention also includes a system 9 for focusing the plasma placed on the periphery of the substrate and arranged to improve the distribution of the temperature and the plasma in the region where the synthesis of the solid material will take place and where the deposition is done.

The system 9 for focusing the plasma is for example formed by a ring placed around the substrate and offset toward the top of the chamber relative to the substrate. The focusing system 9 can also be formed by a set of metal wires bent substantially in an inverted U shape and placed around the substrate. The system for focusing the plasma is powered by a sixth voltage source 10, which provides a direct current. The ring shape for focusing the plasma in relation to the filament is preferably made by two half circles placed on either side of the substrate holder. The system 9 for focusing the plasma is preferably placed so as to be inclined toward the substrate holder in order to better focus the plasma toward the substrate.

The device according to the invention also preferably includes at least one photon beam generator 11 arranged above the chamber and arranged to produce energy rays, in particular infrared (IR) rays, in the form of a photon beam. The number of photon beam generators is determined by the crystallography of the substance and is therefore not limited to that shown in FIG. 3. This or these generators are used to produce energy rays whose frequency is determined by the spectral density function $\psi(\omega, K)$ of the material to be synthesized, where $\omega$ represents the frequency and K represents the wave vector, which may or may not be polarized in a plane. Indeed, the synthesis 29 being encouraged by an absorption of photons having a frequency equal to a frequency present in one of the electromagnetic absorption and inelastic scattering spectrums of the material to be synthesized, the photon beam generators 11 are arranged to produce such photons.

The device is preferably provided with a UV-c ray beam generator 12. The UV-c rays can be used to stimulate the $CH_4 \rightarrow CH^+_3 + H^-$ reaction, which thus causes a higher $CH^*_3$ concentration, which will contribute to the synthesis of the desired material.

Since a plasma must be produced inside the chamber 2, the device according to the invention also includes an inlet connected to a supply source 13 making it possible to introduce a carbon-carrying substance into the chamber, in particular in the form of a carbon carrier gas, and hydrogen ($H_2$). The substance that is introduced is of course in relation to the material to be synthesized. The source is connected to the chamber via a flow rate control valve 14 arranged to regulate the flow rate of the gas injected into the chamber. In order to form diamond, the carbon carrier substance is introduced into the chamber to produce a gas therein comprising substances carrying reactive carbon atoms in the form of radicals or unsaturated molecules from which the synthesis of the material will be done. The carbon carrier gas is for example methane ($CH_4$) or acetylene ($C_2H_2$). This synthesis reaction is known in itself it is for example described in the article by J. E. Butler, Y. A. Mankelevich, A. Cheesman, Jie Ma and M. N. R. Ashfold titled "Understanding the chemical vapor deposition of diamond: recent progress" in the Journal of Physics condensed Matter 21, 2009. If needed, the gas may be preheated by heating 15 before entering the chamber. A gas pumping unit 57 is connected to the chamber to pump the gas and allow balancing of the gas pressure prevailing inside the chamber. In order to form a material other than diamond, the substance necessary to form said material is introduced into the chamber to produce a gas therein comprising substances carrying basic atoms of the reactive material in the form of radicals or unsaturated molecules from which the synthesis of the material will be done.

In a second embodiment of the invention, the synthesis 29 is growth using the Czochralski method. The method according to the second embodiment of the invention makes it possible to synthesize a solid material, for example in particular a monocrystalline solid material, and for example by epitaxy (homo- or hetero-epitaxy). The substrate 21 and/or the synthesized material 31 may then in particular be silicon, $PbWO_4$, $Ba(NO_3)_2$, $KGd(WO_4)_2$, $BaMoO_4$, $SrMoO_4$, $SrWO_4$, $CaMoO_4$, $CaWO_4$, $TeO_2$ or $PbMoO_4$.

Figure 4:
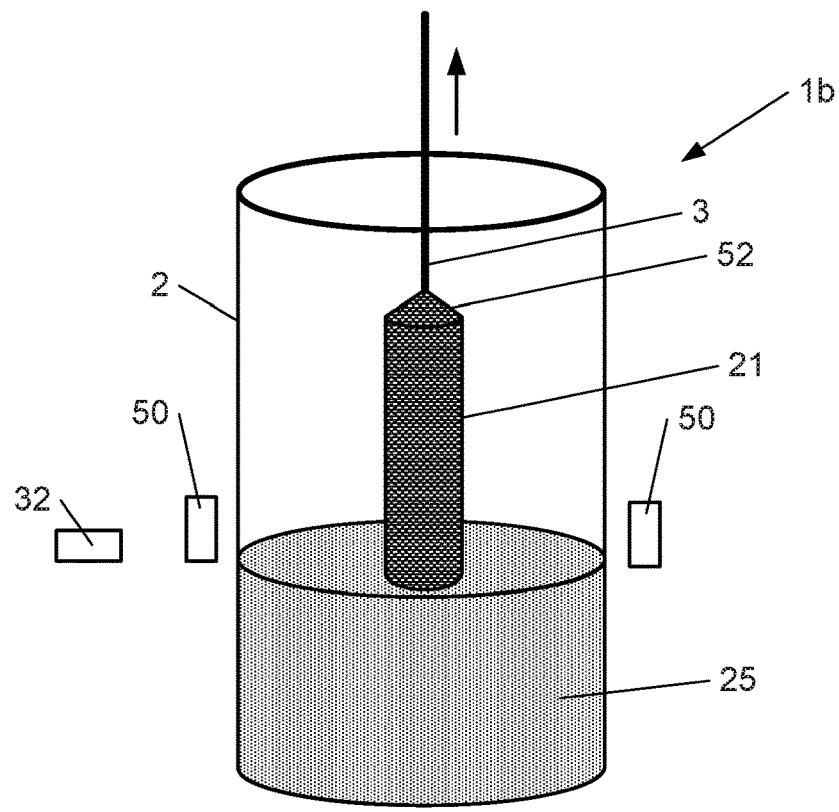

FIG. 4 schematically shows the structure of a device 1b for carrying out the method according to the second embodiment of the invention.

Components in the form of powder and oxide, the mixture of which has the stoichiometry of the material 31 to be synthesized, are placed in an induction furnace in which they are heated to melting. A seed 52, preferably monocrystalline, fastened to one end of an elongate element that is the substrate holder 3, is placed in contact with the liquid thus formed, this liquid including the reagents 25 used for the synthesis 29. Next, while the elongate element is slowly pulled upward, liquid solidifies on the seed, thus leading to the synthesis 29. The elongate element is preferably a rod.

The device 1 according to the invention, whether in its first embodiment (FIG. 3) or its second embodiment (FIG. 4), includes the photon-generating device 32 arranged to send pump photons 26 onto the substrate 21. The photon-generating device 32 comprises one or several pump photon generators 26, for example one or several lasers able to emit frequency pump photons 26 able to place part of the substrate in a state from which a Raman emission is possible. The photon-generating device 32 preferably comprises one or several pump photon generators 26, for example one or several lasers able to emit pump photons 26 allowing, due to their frequency, a transition to an energy state from which a Raman emission is possible. The photon-generating device 32 is perfectly capable of adjusting the polarization of the pump photons 26.

The photon-generating device 32 is potentially arranged in the chamber 2 or in a wall of the chamber 2. The photon-generating device 32 is potentially arranged outside the chamber 2, the chamber 2 then having walls arranged to allow the passage of the pump photons 26.

The photon-generating device 32 may comprise a continuous wave laser or, preferably, a pulsed laser, so as to obtain a very high density of pump photons 26. If the photon-generating device 32 comprises a continuous wave laser, this laser is preferably a high-power laser and arranged to emit a very focused pump photon beam 26. Furthermore, if the photon-generating device 32 comprises a continuous wave laser, the photon-generating device 32 also potentially includes a lens arranged to focus the pump photon beam 26 and spherical dichroic mirrors in order to perform sweeping of the pump photon beam 26.

The device 1 according to the invention may further potentially include a device 50 allowing a change of direction of the Raman photons 27, so as to return the emitted Raman photons 27. This device allowing a change of direction of the Raman photons 27 may include a plurality of mirrors. The substrate 21 is then preferably arranged at the center of one or several resonant cavities including these mirrors. In particular, if Stokes Raman photons are used (FIGS. 2a, 2b), the mirrors are preferably dichroic mirrors reflecting the Stokes photons and transparent for the anti-Stokes photons and for the pump photons 26.

The chamber 2 is arranged so as to be able to place and remove the holder 21 therein. For example, the chamber 2 may include a door 51 arranged to provide access to the substrate 21 held by the substrate holder 3, in particular to place it. This placement may be done by placing the substrate 21 on the substrate holder 3 installed beforehand in the chamber 2 or by placing the substrate 21 and the substrate holder 3, having been positioned together beforehand, in the chamber at the same time. In the device 1a provided for the first embodiment of the invention, the door 51 is arranged to make it possible to deposit the substrate 21 on the substrate holder 3 and remove the substrate 21 from the substrate holder 3. In the device 1b provided for the second embodiment of the invention, the door 51 is arranged to make it possible to place the rod 3 in the chamber 2 and to remove a tube of synthesized material 31 from the chamber 2.

In one embodiment of the invention, the substrate 21, the reagents 25 and the synthesis zone 29 are in one or several optical cavities. This embodiment of the invention may for example be used with Stokes Raman photons 27. In such an embodiment of the invention, a first emission, in reference to FIGS. 2a and 2b, a pump photon 26 induces (FIG. 2a) a spontaneous Stokes emission 24 that creates a first Raman photon 27. This Raman photon 27 is reoriented 30 (FIG. 1) toward the zone where the synthesis 29 occurs, where it induces a stimulated Stokes emission 28. In one embodiment of the invention, where the substrate 21, the reagents 25 and the synthesis zone 29 are in one or several optical cavities, the device 50 allowing a change of direction of the Raman photons 27 is part of the means for steering the Raman photons 27 in the chamber.

Figure 5A:
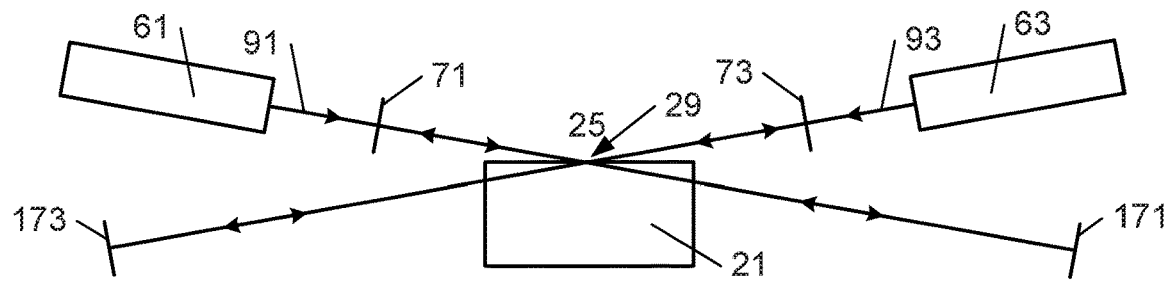
Figure 5B:
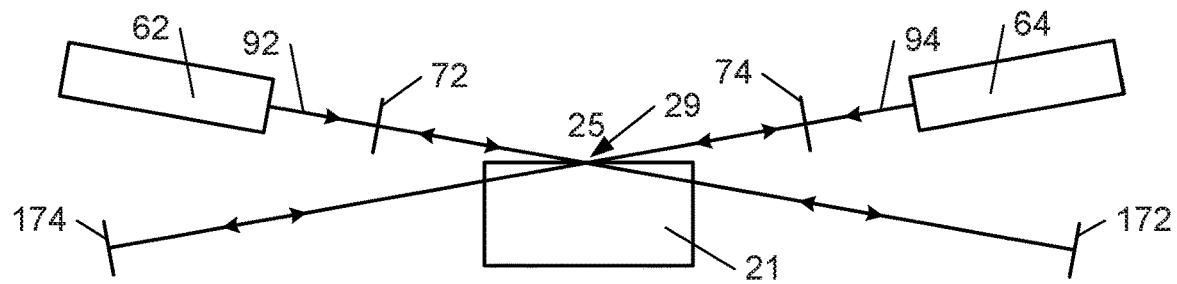
Figure 5C:
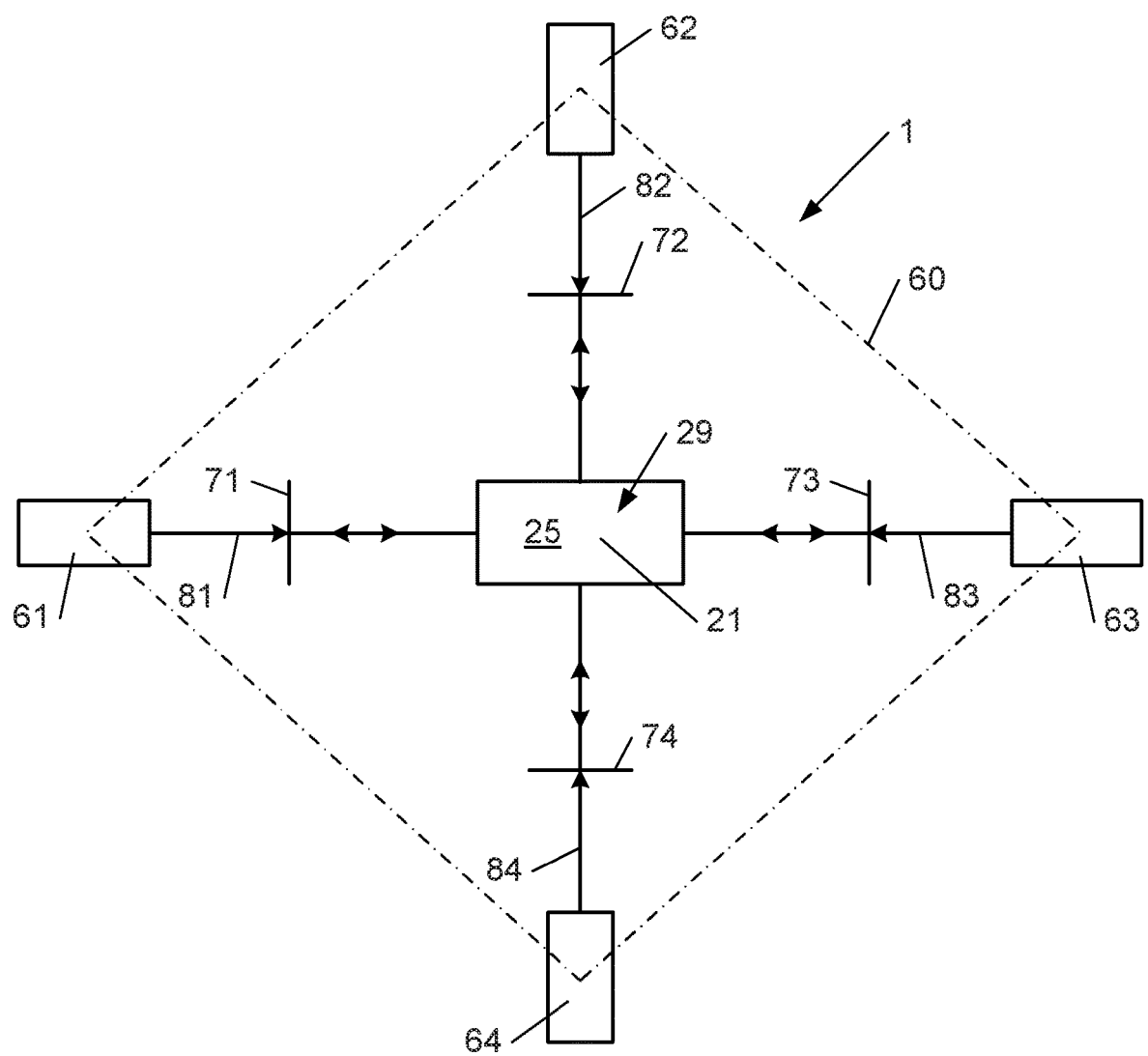

FIG. 5 schematically shows an arrangement of certain elements of the device 1 in an embodiment of the invention where the substrate 21, the reagents 25 and the synthesis zone 29 are in four optical cavities. This arrangement is possible in the first embodiment (FIG. 3) and the second embodiment (FIG. 4) of the device according to the invention. FIG. 5a is a side view in a first direction, FIG. 5b is a side view in a second direction perpendicular to the first direction, and FIG. 5c is a top view.

FIG. 5 shows a first laser 61, a second laser 62, a third laser 63 and a fourth laser 64 that are part of the photon-generating device 32. The illustrated arrangement, in which each laser is at the corner of a diamond 60, is particularly appropriate in the case of a synthesis by epitaxy of a single-crystal diamond with high purity and optical quality by performing a [1,0,0] growth on a rhomb whose faces correspond to the [1,1,0] and [1,0,1] directions, the substrate 21 in turn being diamond. The polarization direction of the pump photons 26 emitted by the lasers 61-64 is chosen to correspond to the maximal Raman gain of the diamond crystal.

FIG. 5 also shows a first mirror 71, a second mirror 72, a third mirror 73, a fourth mirror 74, a fifth mirror 75, a sixth mirror 76, a seventh mirror 77 and an eighth mirror 78 that are part of the device 50 allowing a change of direction of the emitted Raman photons 27. The first mirror 71 and the fifth mirror 171 form a first optical cavity. The second mirror 72 and the sixth mirror 172 form a second optical cavity. The third mirror 73 and the seventh mirror 173 form a third optical cavity. The fourth mirror 74 and the eighth mirror 174 form a fourth optical cavity.

The mirrors 71-74, 171-174 are preferably dichroic mirrors capable of reflecting, toward the synthesis zone 29, photons whose frequency is equal to that of the Raman photons 27 coming from the synthesis zone 29 and capable of allowing pump photons 26 to pass coming from the lasers 61-64 and oriented toward the synthesis zone 29.

The first laser 61 emits a beam 81 of pump photons 26 that traverses the first mirror 71 and arrives on the synthesis zone 29. The second laser 62 emits a beam 82 of pump photons 26 that traverses the second mirror 72 and arrives on the synthesis zone 29. The third laser 63 emits a beam 83 of pump photons 26 that traverses the third mirror 73 and arrives on the synthesis zone 29. The fourth laser 64 emits a beam 84 of pump photons 26 that traverses the fourth mirror 74 and arrives on the synthesis zone 29.

Because the dichroic mirrors 71-74 are arranged to allow the pump photons 26 to pass coming from a laser 61-64, with the laser 61-64 arranged on a first side of the dichroic mirror 71-74, the synthesis zone 29 on a second side of the dichroic mirror 71-74 makes it possible for the pump photons 26 coming from the laser 61-64 to traverse the mirrors 71-74 while the pump photons 26 and the Raman photons 27 coming from the synthesis zone 29 are reflected by the mirrors 71-74 toward the synthesis zone 29.

The mirrors 71 and 171 are arranged face to face on a first optical axis 91, perpendicular to the first optical axis 91, with the substrate 21 between them. The mirrors 72 and 172 are arranged face to face on a second optical axis 92, perpendicular to the second optical axis 92, with the substrate 21 between them. The mirrors 73 and 173 are arranged face to face on a third optical axis 93, perpendicular to the third optical axis 93, with the substrate 21 between them. The mirrors 74 and 174 are arranged face to face on a fourth optical axis 94, perpendicular to the fourth optical axis 94, with the substrate 21 between them.

The Raman emission 28 generates Raman photons 27 that can be reflected in the mirrors 71-74, which corresponds to step 30 for the change of direction of FIG. 1, to return and cause stimulated Raman emissions 28.

In one embodiment of the invention, the substrate 21, the reagents 25 and the synthesis zone 29 are in a ring-shaped resonant cavity.

Figure 6:
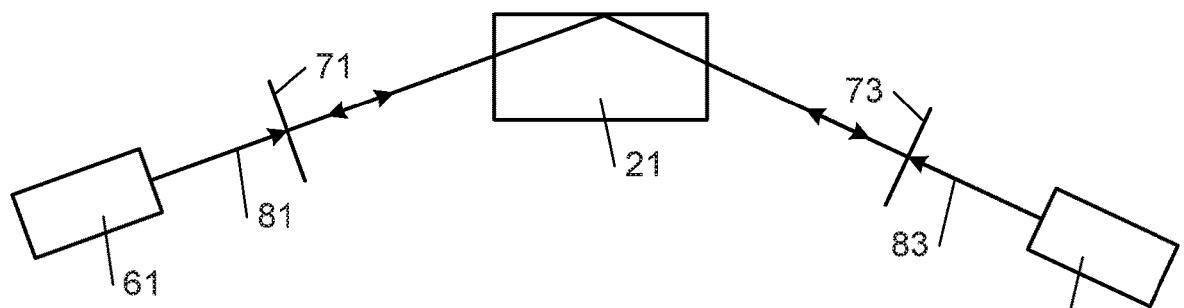
FIG. 6 illustrates an alternative of the invention using the total reflection phenomenon, FIG. 7 schematically shows an arrangement of certain elements of the device in an embodiment of the invention where the substrate, the reagents and the synthesis zone are in a Raman photon generating device, FIG. 8 schematically shows a first use of an anti-Stokes emission to perform phonon pumping, and FIG. 9 schematically shows a second use of an anti-Stokes emission to perform phonon pumping.

FIG. 6 illustrates an alternative of the invention using the total reflection phenomenon. In this alternative of the invention, the lateral configuration illustrated in FIG. 6 replaces the lateral configuration illustrated in FIG. 5a, and potentially the lateral configuration illustrated in FIG. 5b, but the configuration seen from above illustrated in FIG. 5c is still applicable. An incidence angle of the pump photon beams 26 on the substrate 21 is chosen so that the beam undergoes a total reflection on a surface adjacent to the ion plasma 25 or close to the ion plasma 25 in the first embodiment of the invention and adjacent to the liquid 25 or close to the liquid 25 in the second embodiment of the invention.

In one embodiment of the invention, the substrate 21, the reagents 25 and the synthesis zone 29 are outside a Raman photon generating device that may comprise one or several optical cavities.

The embodiment of the invention in which the substrate 21, the reagents 25 and the synthesis zone 29 are outside a Raman photon generating device for example is used with Stokes Raman photons 27. In such a situation, pump photons 26 induce anti-Stokes Raman transitions in the Raman photon generating device that generate anti-Stokes Raman photons 27 that are next sent toward the synthesis zone 29, the substrate and the reagents 25. In one embodiment of the invention where the substrate 21, the reagents 25 and the synthesis zone 29 are outside a Raman photon generating device, the Raman photon generating device is part of the means for steering the Raman photons 27 in the chamber.

The Raman photon generating device emits "probe" or "stimulation" Raman photons. The Raman photon generating device comprises one or several lasers. The Raman photon generating device is preferably capable of adjusting the polarization of the Raman photons. The Raman photon generating device is preferably capable of adjusting the frequency of the Raman photons. The Raman photon generating device is preferably capable of adjusting the phase of the Raman photons.

Figure 7:
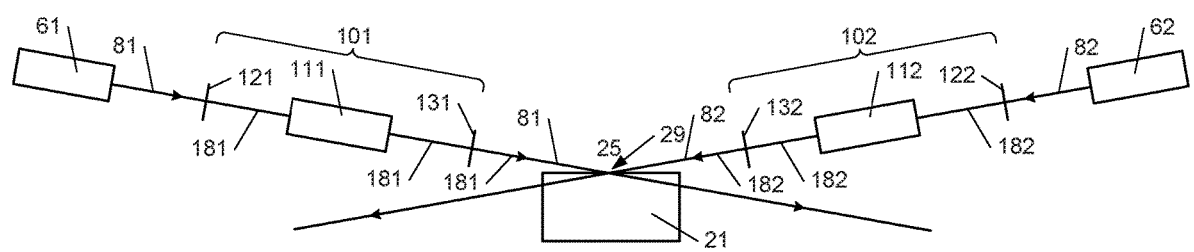

FIG. 7 schematically shows an arrangement of certain elements of the device 1 in an embodiment of the invention where the substrate 21, the reagents 25 and the synthesis zone 29 are located outside a device for generating Raman photons that comprises two optical cavities.

A first laser 61 sends a first beam 81 of pump photons 26 that pass in a first outside optical cavity 101. The first outside optical cavity 101 comprises two dichroic mirrors 121, 131 and a first element 111 able to generate Raman photons 27, for example a diamond crystal of optical quality. The photons 26 induce, in this first element 111 capable of generating Raman photons 27, Raman emissions that are spontaneous or stimulated by Raman photons 27 emitted by this element and returned using the mirrors 121, 131. These Raman emissions generate Raman photons 27 in a Raman beam 181, part of which passes through the mirror 131 and arrives in the synthesis zone 29.

A second laser 62 sends a second beam 82 of pump photons 26 that pass in a second outside optical cavity 102. The second outside optical cavity 102 comprises two dichroic mirrors 122, 132 and a second element 112 able to generate Raman photons 27, for example a diamond crystal of optical quality. The photons 26 induce, in this second element 112 capable of generating Raman photons 27, Raman emissions that are spontaneous or stimulated by Raman photons 27 emitted by this element and returned using the mirrors 122, 132. These Raman emissions generate Raman photons 27 in a Raman beam 182, part of which passes through the mirror 132 and arrives in the synthesis zone 29.

Thus, the pump photons 26 and the Raman photons 27 are present during the synthesis 29 of the material 31, which makes it possible to meet the conditions for a Raman effect in the material.

It is possible for more lasers and/or outside optical cavities to be used, for example four lasers and four optical cavities.

Figure 8:
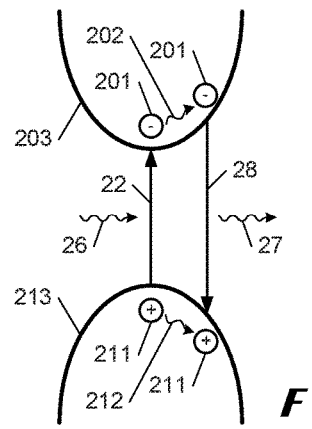

FIG. 8 schematically shows a first use of an anti-Stokes emission to perform phonon pumping. An electron 201-hole 211 pair is created owing to the photon pump 26. The electron 201 is found in the conduction band 203 and the hole 211 and the valance band 213. The pumping of two phonons 202, 212 makes it possible for the energy of the Raman photon 27 emitted during the annihilation of the electron 201-hole 211 pair to be greater than the energy of the pump photon 26.

Figure 9:
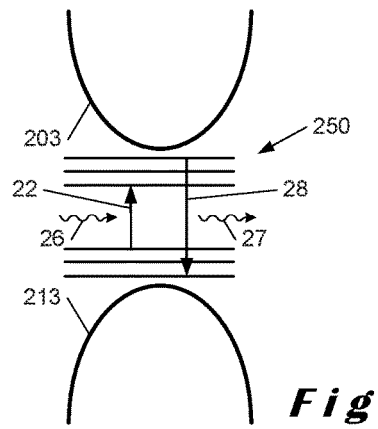

FIG. 9 schematically shows a second use of an anti-Stokes emission to perform phonon pumping. This use assumes that an impurity, for example a colored center in a diamond, creates intermediate energy states 250 between the valence band 213 and the conduction band 203. The photon pump 26 induces an excitation between two of these intermediate energy states. The anti-Stokes Raman emission induces a dropout between two of these intermediate energy states. The pumping of two phonons makes it possible for the energy of the emitted Raman photon 27 to be greater than the energy of the pump photon 26.

In one embodiment of the invention, the frequency of the pump photons 26 and/or Raman photons 27 is chosen specifically to break certain chemical bonds. Thus in particular, chemical bonds corresponding to an amorphous structure can be broken and replaced by chemical bonds corresponding to a crystalline structure. For example, in the case of synthesis of a diamond, sp2 bonds that do not correspond to a crystalline structure can be destabilized by exciting the transition from n to n* by photons with a wavelength of 193 nm. This can be done simultaneously with the synthesis 29 or after the synthesis 29.

In one embodiment of the invention, the pump photons 26 and/or the Raman photons 27 are sent in a grazing manner relative to a surface of the substrate 21 on which the material 31 grows.

In other words, the invention relates to a method and a device for synthesizing a material 31. The method involves a substrate 21 near which reagents 25 are provided. Pump photons 26 and Raman photons 27 make it possible to create a stimulated Raman emission during the synthesis 29 of the material. The Raman emission can be Stokes or anti-Stokes. In one embodiment of the invention, the zone where the synthesis 29 occurs is in an optical cavity and Raman photons 27 emitted by the Raman emission are reoriented toward the zone where the synthesis 29 occurs. In another embodiment of the invention, the zone where the synthesis 29 occurs is not in an optical cavity, and a stream of Raman photons 27 is created in an outside optical cavity before being sent toward the zone where the synthesis 29 occurs. The synthesis 29 preferably involves a chemical vapor deposition (CVD) method or solidification by the Czochralski method.

The present invention has been described in connection with specific embodiments, which have a purely illustrative value and must not be considered limiting. In general, the present invention is not limited to the examples illustrated and/or described above. The use of the verbs "comprise", "include", "have", or any other alternative, as well as their conjugated forms, cannot in any manner preclude the presence of elements other than those mentioned. The use of the definite article "a", "an", or the definite article "the", to introduce an element does not preclude the presence of a plurality of these elements. The reference numbers in the claims do not limit their scope.

The invention claimed is:

1. A method for synthesizing a material (31), the method comprising the following steps:
   1) providing a chamber (2),
   2) placing a substrate (21) arranged to bear the material (31) to be synthesized in the chamber (2),
   3) providing a photon-generating device (32) arranged to send pump photons (26) into the chamber (2),
   4) providing reagents (25) in the chamber (2), near the substrate, to synthesize said material (31),
   5) providing means for steering Raman photons (27) in the chamber (2)
   6) sending into the chamber (2), on a surface of the substrate close to the reagents, the pump photons (26) having a frequency suitable to place at least part of the substrate in a state from which Raman emission is possible,
   wherein the surface of the substrate close to the reagents emits a Raman photon, and
   7) steering the Raman photons (27) emitted by the substrate toward a zone where the synthesis occurs near the substrate (21) for synthesizing the material (31) on the substrate (21) from the reagents (25).

2. The method according to claim 1, wherein the means for steering Raman photons (27) in the chamber (2) comprise a device (50) allowing a change of direction of Raman photons (27) and step D comprises a change of direction of the Raman photons (27).

3. The method according to claim 2, wherein the change of direction of the Raman photons (27) is done using an optical cavity.

4. The method according to claim 1, wherein the means for steering the Raman photons (27) in the chamber (2) comprises a device for generating the Raman photons (27).

5. The method according to claim 4, wherein the device for generating the Raman photons comprises an optical cavity (101, 102) and an element (111, 112) capable of generating the Raman photons (27), and the substrate (21) is arranged outside the device for generating the Raman photons.

6. The method according to claim 1, wherein steps 6) and 7) are simultaneous.

7. The method according to claim 1, further comprising a step for total reflection of the pump photons (26) on a surface close to the reagents (25).

8. The method according to claim 1, wherein the frequency of the Raman photons (27) is lower than the frequency of the pump photons (26).

9. The method according to claim 1, wherein the frequency of the Raman photons (27) is higher than the frequency of the pump photons (26).

10. The method according to claim 9, further comprising creating an electron-hole pair and phonon pumping.

11. The method according to claim 9, wherein intermediate energy states (250) are present between the valence band (213) and the conduction band (203) and further comprise that the pump photons (26) induce excitations between two of these intermediate states and that anti-Stokes Raman emissions stimulated by the Raman photons (27) induce dropouts between two of these intermediate energy states.

12. The method according to claim 1, wherein the material (31) to be synthesized is a solid material, a monocrystalline solid material, a polycrystalline solid material, an amorphous solid material, a solid material able to be synthesized by CVD, a solid material able to be synthesized by epitaxy, a solid material having a diamond-type crystalline structure, a solid material with an identical composition as diamond but being at least partially amorphous or a diamond.

13. The method according to claim 1, wherein the step for providing the reagents (25) in the chamber (2) comprises:
   providing a gas in the chamber (2),
   ionizing at least part of the gas so as to form a plasma comprising ions, and
   wherein the synthesis of the material (31) on the substrate (21) comprises a deposition of ions on the substrate (21).

14. The method according to claim 1, wherein:
   the step for providing the reagents (25) in the chamber (2) comprises providing a liquid in the chamber (2),
   the substrate (21) comprises a seed (52), and
   the synthesis of the material (31) on the substrate (21) on a respective reagent base (25) comprises solidification using the Czochralski method.

15. A device (1) for synthesizing a material (31), the device (1) comprising:
   a chamber (2) comprising:
   a substrate holder (3) arranged so as to hold a substrate (21), and
   a door (51) arranged to place the substrate (21) on the substrate holder (3),
   a photon-generating device (32) arranged so as to send pump photons (26) into the chamber (2) toward the substrate,
   an inlet arranged to make it possible to provide reagents (25) in the chamber (2), and
   means for steering Raman photons (27) emitted in the chamber (2) toward the substrate (21).

16. The device (1) according to claim 15, wherein the means for steering the Raman photons (27) in the chamber comprise a device (50) allowing a change of direction of the Raman photons (27) and capable of steering the Raman photons (27) toward the substrate (21).

17. The device (1) according to claim 16, wherein the device (50) arranged to carry out a change of direction of the Raman photons (27) comprises two mirrors (71, 73) arranged to reflect, toward the substrate (21) held by the substrate holder (3), the Raman photons (27) coming from the substrate (21) held by the substrate holder (3).

18. The device (1) according to claim 17, wherein at least one of the mirrors (71, 73) is a dichroic mirror arranged to allow the pump photons (26) coming from the photon-generating device (32) to pass.

19. The device (1) according to claim 16, wherein the device (50) arranged to carry out a change of direction of the Raman photons (27) comprises an optical cavity.

20. The device (1) according to claim 15, wherein the photon-generating device (32) comprises a pulsed laser.

21. The device (1) according to claim 15, wherein the chamber (2) is arranged to be able to be placed under vacuum and to be able to contain an ion plasma (25) and further comprising a plasma-creating device able to ionize at least part of the gas to form a plasma near the substrate (21) held by the substrate holder (3).

22. The device (1) according to claim 15, wherein the chamber (2) is arranged to be able to contain a liquid (25), in which the substrate holder (3) is an elongate element arranged to be able to pull the substrate (21) into a liquid (25) separation movement and further comprising an inlet arranged to introduce a liquid (25) into the chamber (2).

* * * * *